(12) United States Patent
van den Hoek et al.

(10) Patent No.: US 7,166,531 B1
(45) Date of Patent: Jan. 23, 2007

(54) VLSI FABRICATION PROCESSES FOR INTRODUCING PORES INTO DIELECTRIC MATERIALS

(75) Inventors: Willibrordus Gerardus Maria van den Hoek, Saratoga, CA (US); Nerissa S. Draeger, Milpitas, CA (US); Raashina Humayun, Sunnyvale, CA (US); Richard S. Hill, Atherton, CA (US); Jianing Sun, Fremont, CA (US); Gary William Ray, Mountain View, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/050,621

(22) Filed: Jan. 31, 2005

(51) Int. Cl.
*H01L 21/4763* (2006.01)
*H01L 21/469* (2006.01)

(52) U.S. Cl. .................. 438/623; 438/781; 438/780; 257/E21.576

(58) Field of Classification Search ............. 438/780, 438/692, 618
See application file for complete search history.

(56) References Cited

U.S. PATENT DOCUMENTS

| | | | |
|---|---|---|---|
| 4,357,451 A | 11/1982 | McDaniel | |
| 4,882,008 A | 11/1989 | Garza et al. | |
| 4,885,262 A | 12/1989 | Ting et al. | |
| 5,504,042 A | 4/1996 | Cho et al. | |
| 5,686,054 A | 11/1997 | Barthel et al. | |
| 5,700,844 A | 12/1997 | Hedrick et al. | |
| 5,789,027 A | 8/1998 | Watkins et al. | |
| 5,849,640 A | 12/1998 | Hsia et al. | |
| 5,851,715 A | 12/1998 | Barthel et al. | |
| 5,858,457 A | 1/1999 | Brinker et al. | |
| 5,920,790 A | 7/1999 | Wetzel et al. | |
| 6,140,252 A | 10/2000 | Cho et al. | |
| 6,171,661 B1 | 1/2001 | Zheng et al. | |
| 6,177,329 B1 | 1/2001 | Pang | |
| 6,232,658 B1 | 5/2001 | Catabay et al. | |
| 6,258,735 B1 | 7/2001 | Xia et al. | |
| 6,268,276 B1 | 7/2001 | Chan et al. | |
| 6,270,846 B1 | 8/2001 | Brinker et al. | |
| 6,271,273 B1 | 8/2001 | You et al. | |
| 6,312,793 B1 | 11/2001 | Grill et al. | |
| 6,329,017 B1 | 12/2001 | Liu et al. | |

(Continued)

FOREIGN PATENT DOCUMENTS

WO    WO95/07543    3/1995

OTHER PUBLICATIONS

R.D. Miller et al., "Phase-Separated Inorganic-Organic Hybrids for Microelectronic Applications," MRS Bulletin, Oct. 1997, pp. 44-48.

(Continued)

*Primary Examiner*—Michael Lebentritt
*Assistant Examiner*—Elias Ullah
(74) *Attorney, Agent, or Firm*—Beyer Weaver & Thomas LLP

(57) ABSTRACT

Porous dielectric layers are produced by introducing pores in pre-formed composite dielectric layers. The pores may be produced after the barrier material, the metal or other conductive material is deposited to form a metallization layer. In this manner, the conductive material is provided with a relatively smooth continuous surface on which to deposit.

36 Claims, 7 Drawing Sheets

U.S. PATENT DOCUMENTS

| | | | |
|---|---|---|---|
| 6,329,062 B1 | 12/2001 | Gaynor | |
| 6,340,628 B1 | 1/2002 | Van Cleemput et al. | |
| 6,365,266 B1 | 4/2002 | MacDougall et al. | |
| 6,383,466 B1 | 5/2002 | Domansky et al. | |
| 6,383,955 B1 | 5/2002 | Matsuki et al. | |
| 6,386,466 B1 | 5/2002 | Ozawa et al. | |
| 6,387,453 B1 | 5/2002 | Brinker et al. | |
| 6,391,932 B1 | 5/2002 | Gore et al. | |
| 6,392,017 B1 | 5/2002 | Chandrashekar | |
| 6,420,441 B1 | 7/2002 | Allen et al. | |
| 6,444,715 B1 | 9/2002 | Mukherjee et al. | |
| 6,455,417 B1 | 9/2002 | Bao et al. | |
| 6,479,374 B1 | 11/2002 | Ioka et al. | |
| 6,500,770 B1 | 12/2002 | Cheng et al. | |
| 6,548,113 B1 | 4/2003 | Birnbaum et al. | |
| 6,573,030 B1 | 6/2003 | Fairbairn et al. | |
| 6,576,345 B1 | 6/2003 | Cleemput et al. | |
| 6,596,467 B1 | 7/2003 | Gallagher et al. | |
| 6,596,654 B1 | 7/2003 | Bayman et al. | |
| 6,610,362 B1 | 8/2003 | Towle | |
| 6,632,478 B1 | 10/2003 | Gaillard et al. | |
| 6,667,147 B1 | 12/2003 | Gallagher et al. | |
| 6,677,251 B1 | 1/2004 | Lu et al. | |
| 6,715,498 B1 | 4/2004 | Humayun et al. | |
| 6,753,250 B1 | 6/2004 | Hill et al. | |
| 6,756,085 B1 | 6/2004 | Waldfried et al. | |
| 6,797,643 B1 | 9/2004 | Rocha-Alvarez et al. | |
| 6,805,801 B1 | 10/2004 | Humayun et al. | |
| 6,812,043 B1 | 11/2004 | Bao et al. | |
| 6,815,373 B1 | 11/2004 | Singh et al. | |
| 6,831,284 B1 | 12/2004 | Demos et al. | |
| 6,846,380 B1 | 1/2005 | Dickinson et al. | |
| 6,848,458 B1 | 2/2005 | Shrinivasan et al. | |
| 6,849,549 B1 * | 2/2005 | Chiou et al. | 438/692 |
| 6,867,086 B1 | 3/2005 | Chen et al. | |
| 6,903,004 B1 | 6/2005 | Spencer et al. | |
| 6,914,014 B1 | 7/2005 | Li et al. | |
| 7,018,918 B1 * | 3/2006 | Kloster et al. | 438/623 |
| 2002/0001973 A1 | 1/2002 | Wu et al. | |
| 2002/0016085 A1 | 2/2002 | Huang et al. | |
| 2002/0034626 A1 | 3/2002 | Liu et al. | |
| 2002/0064341 A1 | 5/2002 | Fauver et al. | |
| 2002/0106500 A1 | 8/2002 | Albano et al. | |
| 2002/0123240 A1 | 9/2002 | Gallagher et al. | |
| 2002/0141024 A1 | 10/2002 | Retschke et al. | |
| 2002/0192980 A1 | 12/2002 | Hogle et al. | |
| 2003/0064607 A1 | 4/2003 | Leu et al. | |
| 2003/0119307 A1 | 6/2003 | Bekiaris et al. | |
| 2003/0157248 A1 | 8/2003 | Watkins et al. | |
| 2003/0198895 A1 | 10/2003 | Toma et al. | |
| 2004/0069410 A1 | 4/2004 | Moghadam et al. | |
| 2004/0096586 A1 | 5/2004 | Schulberg et al. | |
| 2004/0096593 A1 | 5/2004 | Lukas et al. | |
| 2004/0096672 A1 | 5/2004 | Lukas et al. | |
| 2004/0099952 A1 | 5/2004 | Goodner et al. | |
| 2004/0101633 A1 | 5/2004 | Zheng et al. | |
| 2004/0102031 A1 | 5/2004 | Kloster et al. | |
| 2004/0161532 A1 | 8/2004 | Kloster et al. | |
| 2004/0170760 A1 | 9/2004 | Meagley et al. | |
| 2004/0185679 A1 | 9/2004 | Ott et al. | |
| 2005/0064698 A1 | 3/2005 | Chang et al. | |

OTHER PUBLICATIONS

Jin et al., "Nanoporous Silica as an Ultralow-$k$ Dielectric," MRS Bulletin, Oct. 1997, pp. 39-42.

Asoh et al., "Fabrication of Ideally Ordered Anodic Porous Alumina with 63 nm Hole Periodocity Using Sulfuric Acid," J. Vac. Sci. Technol. B 19(2), Mar./Apr. 2001, pp. 569-572.

Asoh et al., "Conditions for Fabrication of Ideally Ordered Anodic Porous Alumina Using Pretextured Al," Journal of the Electrochemica Society, 148 (4) B152-B156 (2001) pp. B152-B156.

Holland et al., "Nonlithographic Technique for the Production of Large Area High Density Gridded Field Sources," J. Vac. Sci. Technol. B 17(2), Mar./Apr. 1999, pp. 580-582.

Masuda et al. "Highly Ordered Nanochannel-Array Architecture in Anodic Alumina," App. Phys. Lett. 71(19), Nov. 1997, pp. 2770-2772.

Clube et al., White Paper from Holotronic Technologies SA; downloaded from www.hdotronic.com/whitepaper/fine-patt.pdf on Mar. 12, 2002.

Meli et al., "Self-Assembled Masks for the Transfer of Nanometer-Scale Patterns into Surfaces: Characterization by AFM and LFM", Nano Letters, vol. 2, No. 2, 2002, 131-135.

"Shipley Claims Porous Low K Dielectric Breakthrough," Press Release Mar. 17, 2003.

Jeffrey M. Calvert and Michael K. Gallagher, Semiconductor International, 26 (12), 56 (2003).

Van Bavel et al., Future Fab International, 61, (2004).

Caluwaerts et al, "Post Patterning Meso Porosity Creation: A Potential Solution For Pore Sealing," IITC 2003.

U.S. Office Action mailed May 31, 2006, from U.S. Appl. No. 10/941,502.

U.S. Office Action mailed May 30, 2006, from U.S. Appl. No. 10/785,235.

U.S. Office Action mailed May 31, 2006, from U.S. Appl. No. 10/849,568.

U.S. Office Action mailed Jun. 15, 2006, from U.S. Appl. No. 10/800,409.

Kelman et al., "Method for Reducing Stress in Porous Dielectric Films", U.S. Appl. No. 11/369,311, filed Mar. 6, 2006.

U.S. Office Action mailed Jun. 28, 2006, from U.S. Appl. No. 10/825,888.

U.S. Office Action mailed May 2, 2006, from U.S. Appl. No. 10/295,965.

U.S. Office Action mailed Aug. 9, 2005, from U.S. Appl. No. 10/295,965.

U.S. Office Action mailed Jun. 14, 2006, from U.S. Appl. No. 10/789,103.

U.S. Office Action mailed Aug. 24, 2005, from U.S. Appl. No. 10/404,693.

U.S. Office Action mailed Sep. 1, 2005, from U.S. Appl. No. 10/672,305.

Cho et al., "Plasma Treatments of Molecularly Templated Nanoporous Silica Films," Electrochemical and Solid-State Letters, 4 (4) G35-G38 (2001).

Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.

Schulberg et al., "System for Deposition of Mesoporous Materials," U.S. Appl. No. 10/295,965, filed Nov. 15, 2002, 64 Pages.

Watkins et al., "Mesoporous Materials and Methods," U.S. Appl. No. 10/301,013, filed Nov. 21, 2002, 34 Pages.

Justin F. Gaynor, "In-Situ Treatment of Low-K Films With a Silylating Agent After Exposure To Oxidizing Environments," U.S. Appl. No. 10/056,926, filed Jan. 24, 2002, 34 Pages.

Humayun et al., "Method for Forming Porous Films By Porogen Removel Combined With In SITU Surface Modification", Novellus Corporation, U.S. Appl. No. 10/404,693, filed Mar. 31, 2003, pp. 1-32.

Tipton et al., "Method Of Porogen Removal From Porous Low-K Films Using UV Radiation", Novellus Systems, Inc., U.S. Appl. No. 10/672,311, filed Sep. 26, 2003, pp. 1-27.

Jan, C.H., et al, *90NM Generation, 300mm Wafer Low k ILD/Cu Interconnect Technology*, 2003 IEEE Interconnect Technology Conference.

Wu et al., U.S. Appl. No. 10/789,103, entitled: Methods For Producing Low-K CDO Films With Low Residual Stress.

Wu et al., U.S. Appl. No. 10/820,525, entitled: Methods For Producing Low-K CDO Films With Low Residual Stress.

Wu et al., U.S. Appl. No. 10/800,409, entitled: Methods For Producing Low-K CDO Films.

U.S. Appl. No. 10/016,017, filed Dec. 12, 2001.

U.S. Appl. No. 10/125,614, filed Apr. 18, 2002.

U.S. Appl. No. 10/202,987, filed Jul. 23, 2002.

Tipton et al., "Method for Removal of Porogens From Porous Low-K Films Using Supercritical Fluids", Novellus Systems, Inc., U.S. Appl. No. 10/672,305, filed Sep. 26, 2003, pp. 1-32.

Gangpadhyay et al., "The First International Surface Cleaning Workshop," Northeastern University, Nov. 11-14, 2002.

Cho et al., "Method and Apparatus for UV Exposure of Low Dielectric Constant Materials for Porogen Removal and Improved Mechanical Properties", Novellus Systems, Inc., U.S. Appl. No. 10/800,377, filed Mar. 11, 2004, pp. 1-31.

Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.

Humayun et al., "Method For Forming Porous Films By Porogen Removal Combined With In Situ Modification", U.S. Appl. No. 10/404,693, filed Mar. 31, 2003, Office Action dated Mar. 15, 2005.

Tipton et al., "Method Of Porogen Removal From Porous Low-K Films Using UV Radiation", U.S. Appl. No. 10/672,311, filed Sep. 26, 2003, Office Action dated Sep. 7, 2004.

Tipton et al., "Method Of Porogen Removal From Porous Low-K Films Using UV Radiation", U.S. Appl. No. 10/672,311, filed Sep. 26, 2003, Office Action dated Dec. 28, 2004.

Tipton et al., "Method For Removal Of Porogens From Porous Low-K Films Using Supercritical Fluids", U.S. Appl. No. 10/672,305, Office Action dated Mar. 22, 2005.

Bandyopadhyay et al., "Method to Improve Mechanical Strength of Low-K Dielectric Film Using Modulated UV Exposure", U.S. Appl. No. 10/825,888, filed Apr. 16, 2004.

Peter Singer, "New Materials and Designs to Improve Transistor Performance", Apr. 1, 2004, Semiconductor International.

Ghani et al, "A 90nm High Volume Manufacturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

Varadarajan, et al., "Strained Transistor Architecture and Method", Novellus Systems, Inc., U.S. Appl. No. 10/923,259, filed Aug. 20, 2004, pp. 1-24.

Niu et al., "Methods For Improving The Cracking Resistance Of Low-K Dielectric Materials", U.S. Appl. No. 10/860,340, filed Jun. 2, 2004.

Niu et al., "Methods For Improving The Cracking Resistance Of Low-K Dielectric Materials", U.S. Appl. No. 10/860,340, Office Action dated Mar. 2, 2005.

Niu et al., "Methods For Improving The Cracking Resistance Of Low-K Dielectric Materials", U.S. Appl. No. 10/860,340, Final Office Action dated Jun. 13, 2005.

Wang et al., "Plasma Detemplating And Silanol Capping Of Porous Dielectric Films", U.S. Appl. No. 10/785,235, filed Feb. 23, 2004.

Varadarajan et al., "Tensile Dielectric Films Using UV Curing", U.S. Appl. No. 10/972,084, filed Oct. 22, 2004.

Fox et al., "Method For Improving Mechanical Properties Of Low Dielectric Constant Materials", U.S. Appl. No. 10/849,568, filed May 18, 2004.

Fox et al., "Methods For Producing Low-Stress Carbon-Doped Oxide Films With Improved Integration Properties", U.S. Appl. No. 10/987,208, filed Nov. 12, 2004.

Draeger et al., "Creation Of Porosity In Low-K Films By Photo-Disassociation Of Imbedded Nanoparticles," U.S. Appl. No. 11/146,456, filed Jun. 6, 2005.

Wu et al., "Methods For Producing Low Stress Porous Low-K Dielectric Materials Using Precursors With Organic Functional Groups", U.S. Appl. No. 10/927,777, filed Aug. 27, 2004.

Wu et al., "Methods For Improving Integration Performance Of Low Stress CDO Films", U.S. Appl. No. 10/941,,502, filed Sep. 14, 2004.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

Cho et al., "Method for Porogen Removal and Mechanical Strength Enhancement of Low-K Carbon Doped Silicon Oxide Using Low Thermal Budget Microwave Curing", U.S. Appl. No. 11/280,113, filed Nov. 15, 2005.

Subramonium et al., "Pulsed PECVD Method for Modulating Hydrogen Content in Hard Mask", U.S. Appl. No. 11/318,269, filed Dec. 23, 2005.

U.S. Office Action mailed Feb. 28, 2006, from U.S. Appl. No. 10/404,693.

U.S. Office Action mailed Mar. 29, 2006, from U.S. Appl. No. 10/800,377.

U.S. Office Action mailed Dec. 27, 2005, from U.S. Appl. No. 10/789,103.

U.S. Office Action mailed Dec. 23, 2005, from U.S. Appl. No. 10/800,409.

U.S. Office Action mailed Feb. 7, 2006, from U.S. Appl. No. 10/672,305.

U.S. Office Action mailed Dec. 20, 2005, from U.S. Appl. No. 10/672,311.

U.S. Office Action mailed Dec. 20, 2005, from U.S. Appl. No. 10/849,568.

U.S. Office Action mailed Jan. 9, 2006, from U.S. Appl. No. 10/785,235.

U.S. Office Action mailed Jul. 13, 2005, from U.S. Appl. No. 10/672,311.

U.S. Office Action mailed Jul. 27, 2005, from U.S. Appl. No. 10/785,235.

* cited by examiner

VLSI FABRICATION PROCESSES FOR INTRODUCING PORES INTO DIELECTRIC MATERIALS

CROSS-REFERENCE TO RELATED APPLICATIONS

This application is related to the following U.S. patent applications: U.S. patent application Ser. No. 10/171,289, filed on Jun. 12, 2002, titled "Method of Fabricating Low Dielectric Constant Dielectric Films" by Hill et al., U.S. patent application Ser. No. 10/803,234, filed on Mar. 17, 2004, titled "Method of Fabricating Low Dielectric Constant Dielectric Films" by Hill et al., U.S. patent application Ser. No. 10/785,235, filed on Feb. 23, 2004, titled "Plasma Detemplating and Silanol Capping of Porous Dielectric Films" by Wang et al., U.S. patent application Ser. No. 10/825,888, filed on Mar. 16, 2004, titled "Method to Improve Mechanical Strength of Low-K Dielectric Film Using Modulated UV Exposure" by Bandyopadhyay et al., U.S. patent application Ser. No. 10/789,103, filed on Feb. 27, 2004, titled "Methods for Producing Low-K CDO Films With Low Residual Stress" by Wu et al., and U.S. patent application Ser. No. 10/860,340, filed Jun. 2, 2004, titled "Methods For Improving The Cracking Resistance Of Low-K Dielectric Materials" by Niu et al. Each of these patent applications is incorporated herein by reference for all purposes.

BACKGROUND

This invention relates to low dielectric constant layers for use in various applications. The invention also relates to methods of forming low dielectric constant layers and integrating them into a wide range of VLSI fabrication operations.

As the feature sizes of microelectronic integrated circuits devices are reduced, the electrical properties of the materials that constitute the devices will require change and improvement. One material that must be improved is the electrical insulator ("dielectric") used between the wires, metal lines, and other elements of the circuit. Without improvement in the insulator material, there will be increased problems due to capacitive effects such as coupling (crosstalk) and propagation delay. The speed at which future circuits will operate will be limited by RC delay in the interconnect. These difficulties can be mitigated by preparing the circuit using an insulating layer that possesses a dielectric constant as low as possible (i.e., a "low-k" dielectric layer).

Earlier technology nodes (i.e., the sets of VLSI fabrication technologies associated with particular critical dimensions) employed dense materials such as silicon dioxide, silicon nitride, and cured silsesquioxanes as insulators. However, the dielectric constants of these materials range from 3.0–7.0. These values will be inadequate for future circuits. As yet the only fully dense. (non-porous) materials with a dielectric constant less than about 2.4 are fluorinated polymers or fully aliphatic hydrocarbon polymers, but these have not met requirements for adhesion and thermal stability.

Thus, considerable effort has been directed towards the development of porous dielectric materials. These can be thought of as composite materials, with the value of their dielectric constants intermediate between that of air (dielectric constant of 1.0) and the fully dense phase. Several classes of porous dielectric films, including porous oxides and porous polymers have been described in the art. Pore in these materials typically have dimensions in the nanometer range (e.g., about 1 to 50 nanometers). The materials are sometimes referred to as "nanoporous" or "mesoporous."

Nanoporous silica films are formed by a variety of techniques. In one example, a process deposits a monomeric precursor such as tetraethylorthosilicate or TEOS (a siloxane) onto a substrate using a solvent, and then cross-links the precursors to form a continuous porous solid network. The resultant films are dried by direct solvent evaporation or treatment with supercritical fluids. The films are then subjected to a high-temperature annealing step. See for example, Changming et al., *Materials Research Society Bulletin*, vol. 22, no. 10, pp. 39–42 (1997).

Other approaches involve forming a stable composite film (sometimes referred to herein as a "precursor film") containing two components: a removable porogen and a structure former or dielectric material (e.g., a silicon containing material). After the composite film is formed on the substrate, the porogen component is removed, leaving a structurally intact porous dielectric matrix. Porogens are frequently organic compounds such as polyfunctional cyclic hydrocarbon compounds. Techniques for removing porogens from the composite film include, for example, thermal processes, e-beam exposure, ultra-violet radiation exposure, plasma treatments, and solvent extraction employing supercritical solutions.

In a related approach, a mesoporous dielectric matrix is formed using a block copolymer such as a polyethylene oxide (PEO)-polypropylene oxide (PPO) block copolymer. The polymer is deposited and the PEO and PPO blocks segregate into separate phases, with the PPO phase regions being more hydrophobic and the PEO phase regions being more hydrophilic. The two-phase polymer is sometimes referred to as a "template." The dielectric matrix is created by infusing a dielectric precursor (e.g., TEOS) and a catalyst into the polymer template where one or both of them preferentially accumulate in one phase. In the favored phase, the catalyst promotes reaction of the dielectric precursor to form the dielectric. Thus, the dielectric matrix forms selectively in one phase of the template. The other phase (the "porogen") can be removed subsequently by various techniques such as plasma treatment.

As used herein, the term porogen is intended to encompass any type of material that forms a removable second phase in a composite layer that serves as a precursor to the dielectric matrix. The porogen may be arranged in an ordered or non-ordered fashion within the dielectric matrix.

Another technique for producing porous low-k films employs inorganic-organic nanophase-separated hybrid polymer materials. These materials comprise organic polymers cast with silsesquioxane-based ladder-type polymeric structures. A casting solvent is used to dissolve the inorganic and organic polymer components. The materials are spin coated onto a substrate and upon application of high-temperature, the hybrid phase-separated polymer materials are formed. See for example, Miller et al., *Materials Research Society Bulletin*, vol. 22, no. 10, pp. 44–48 (1997).

Certain problems arise in VLSI processing of partially fabricated devices having a porous dielectric material. A first problem arises in porous "open cell" dielectric materials, in which the individual pores contact and open into one another. The pores of these materials provide long paths throughout the interior of the dielectric material. Gases and liquids contacting the outer surfaces of open cell dielectric materials can penetrate deep into the layer's interior. This gives rise to a particularly difficult problem during conformal depositions of conductive barrier layers or seed layers. Precursor gases or plasma for these processes penetrate deep into the open cell matrix where they deposit and form the conductive barrier or seed materials. This renders large portions of the dielectric layer unacceptably conductive. A similar problem is now encountered in closed cell dielectric materials, even where the pore sizes are significantly smaller than the VLSI feature dimensions.

Examples of extremely conformal deposition processes where the problem is most pronounced include certain forms of chemical vapor deposition (CVD) and atomic layer deposition (ALD). Less conformal processes such as physical vapor deposition (PVD) do not deposit conductive material within the pore network, but they do a poor job of covering the discontinuous porous side-walls of a trench or via.

Another problem arises because porous materials lack the mechanical strength of non-porous materials. As a consequence, when a planarization technique such as chemical mechanical polishing (CMP) is employed to remove excess copper or other material, the pressure applied to the wafer during that process can crack or crush the underlying dielectric material.

The current porous materials and associated processing techniques have thus far failed to meet the demands of next generation VSLI fabrication. Obviously, the problems will only increase as technologies move to smaller feature dimensions. Improved methodologies for integrating low-k dielectric materials into VLSI devices are required.

SUMMARY

The present invention overcomes these problems by providing a process in which voids are introduced in a layer of dielectric only after some or all process steps associated with creating conductive lines are completed. Thus, in one embodiment, the voids are produced only after the conductive lines have been formed and the material removal (planarization) process has been completed. As a consequence, in a damascene process flow for example, the dielectric etch, barrier deposition, metal deposition, and planarization steps are all performed on stable, non-porous materials. Only after these process steps are complete are the voids introduced in the dielectric layer. In this manner, the interior regions of the dielectric layer are protected from exposure to conductive barrier materials and metals. In addition, the barrier materials and seed metals are provided with non-porous dielectric surfaces for depositing as relatively smooth continuous thin films. Still further, because the voids are typically introduced after planarization/material removal, the more fragile porous dielectric layer is not directly exposed to the mechanical stress of planarization.

In one aspect, the invention is characterized as a method of forming conductive lines on a substrate (e.g., an electronic device such as a partially fabricated integrated circuit). This method includes the following sequence: (a) providing a layer of composite dielectric material on the substrate; (b) optionally treating the dielectric network in a manner that shrinks and/or strengthens the layer of dielectric material; (c) patterning the layer of composite dielectric material to define paths for the conductive lines; (d) filling the paths with conductive material; and (e) after filling the paths in (d), removing at least some of the porogen from the layer of composite dielectric material to produce a porous dielectric network. The composite dielectric material includes at least a dielectric network and a porogen.

Filling the paths with conductive material may include, for example, depositing a diffusion barrier layer, as well as filling the paths with a metal or other conductive material. The conductive material is formed by electroplating in the case of a conventional Damascene process. Further, the overall process may additionally require removing excess conductive material formed in (d) prior to removing the porogen in (e). This material removal operation typically forms an exposed pattern of conductive lines in the composite dielectric material.

In treating the dielectric network to cause shrinkage, the process may produce a side benefit of strengthening the dielectric network. For example, the process may increase the material's modulus, hardness, crack resistance and/or toughness (resistance to crack propagation). Examples of techniques for shrinking the material include exposing the dielectric network to at least one of the following: ultraviolet radiation, e-beam radiation, thermal treatment and a plasma. To remove porogen from the layer of composite dielectric material the process may involve exposing the composite dielectric material to at least one of the following: a supercritical solvent, a plasma, a thermal treatment, ultraviolet radiation, and e-beam radiation.

The conductive lines are frequently made from a metal such as copper and the dielectric is usually a non-porous material such as silicon oxide, silicon oxycarbide (also known as carbon doped silicon oxide or CDO), fluorinated silicate glass, silicon nitride, a spin-on organic material, a spin-on inorganic material, or a spin-on inorganic-hybrid material.

In another aspect, the invention involves forming a layer of conductive lines on a substrate according to the following sequence: (a) forming a layer of porous dielectric material on the substrate; (b) filling at least some pores in the dielectric material with a sealant; (c) patterning the layer of composite dielectric material to define paths for the conductive lines; (d) filling the paths with conductive material; and (e) after filling the paths in (d), removing at least some of the sealant from the dielectric material. In this approach a sealant is first added to a pre-formed dielectric matrix and subsequently removed. In this aspect of the invention, operations (b) and (c) can be performed in either order.

The sealant serves much the same role as a porogen. It renders the porous surface of the dielectric relatively smooth and continuous surface to improve the quality of subsequently deposited layers such a barrier layers and seed layers. Examples of sealant materials include conventional photoresist materials, BARC (bottom anti-reflective coating) materials, and other materials such as benzocyclobutene (BCB). The sealant may be inserted into the porous dielectric material by a process such as spin on techniques, chemical vapor deposition, in situ polymerization techniques, liquid impregnation, vapor impregnation, and supercritical injection.

Yet another aspect of the invention pertains to other methods of forming layers of conductive lines on a substrate, according to the following sequence: (a) directly forming a dielectric layer comprising a dielectric network on the substrate; (b) patterning the dielectric layer to define paths for the conductive lines; (c) filling the paths with conductive material; and (d) after filling the paths in (c), removing porogen from the dielectric layer to produce a porous dielectric network. In this aspect of the invention, the as deposited dielectric network comprises a three-dimensional covalent network. It is formed without curing or polymerizing as deposited material. The porogen may be deposited together with the dielectric network or added at a later time.

These and other features and advantages of the present invention will be described in more detail below with reference to the associated drawings.

DETAILED DESCRIPTION

Introduction

Figure 1A:
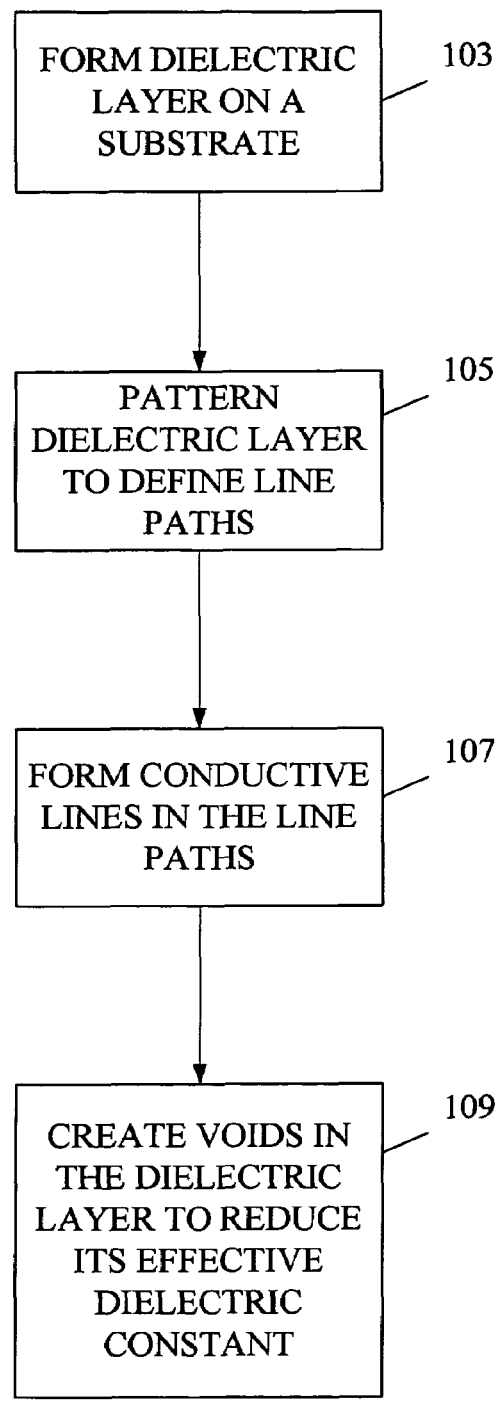
FIG. 1A is a process flow chart depicting a general method of integrating a layer of low-k dielectric material in accordance with an embodiment of this invention.

This invention pertains to devices and methods of fabricating such devices by introducing voids into a dielectric layer, but preferably only after the dielectric material has been patterned and further processed to form conformal layers on its patterned surface. In typical embodiments, the voids are not introduced until after the dielectric material is deposited, etched, inlaid, and planarized. Exemplary methods for performing this invention will be presented below.

In many cases, the dielectric material serves as an intermetal dielectric in an integrated circuit and the patterning defines line paths and/or vias. Introducing the voids renders the dielectric layer porous and effectively reduces the dielectric constant of the layer, and thereby improves performance of the integrated circuit.

Frequently, the dielectric layer is initially a two-phase material comprising a dielectric network together with a porogen that occupies void regions within the dielectric network. The porogen is ultimately removed from the dielectric matrix to leave behind a porous structure having a lowered dielectric constant. But during early stages of dielectric processing (e.g., patterning, conformal deposition, planarization, etc.), the porogen remains in place to provide a composite dielectric substrate that presents a continuous non-porous surface onto which thin continuous layers may be deposited (e.g., diffusion barrier and seed layer layers). Further, the presence of the porogen during early stage processing lends additional strength to the dielectric layer to resist crushing during planarization processes.

In some cases, the porogen is present when the dielectric layer is formed on a substrate. In other cases, the porogen is inserted into the pores of a dielectric layer that was formed in a porous state or was rendered porous after deposition. In the former cases, the deposition conditions are tailored to form the porogen and dielectric matrix concurrently. Exemplary processes include chemical vapor deposition, spin on processes, and in situ formation of the dielectric matrix in a two-phase template. In the later cases, a specific infusion technique is employed to introduce the porogen as described below.

Using this invention, the significant difficulties encountered integrating the more conventional porous materials are reduced or eliminated. First, this invention reduces the problems specific to deposition of thin layers on porous surfaces. Specifically, conductive materials cannot penetrate to the dielectric interior regions when formed by conformal or partially conformal deposition processes. Second, the invention can reduce the porous material's susceptibility to damage during CMP or other planarization technique.

Terminology

Throughout the specification, various terms are employed to describe the new concepts of this invention. Those terms may be well known to those skilled in the art. However, to ensure a consistent understanding of the terminology, the following explanations are provided.

In many cases, the dielectric materials employed at early and intermediate stages of fabrication processes described herein are characterized as "composite" dielectric materials. These possess at least two phases, a dielectric network and a porogen. Together they form a generally continuous condensed phase material. In one example, a composite dielectric layer includes a carbon doped silicon oxide as dielectric network and a polyfunctional hydrocarbon as a porogen.

When the porogen is removed, the dielectric network forms a porous structure having pores or voids distributed throughout its volume. The pores may define an open cell or a closed cell structure. Depending upon the application, the pores may have a particular mean or average size and size distribution. Typically, the mean pore size is significantly smaller than the line widths (e.g., at least about 2×). For IC fabrication employing 90 nanometer line widths, the mean size of pores is preferably between about 5 and 100 Angstroms. Note that all normal dielectric materials for IC applications are "porous" at some level. In carbon doped oxide films, for example, there "pores" within the dielectric network are generated by covalent "cages" or terminal methyl groups. These very small, molecular-scale voids are not considered pores within the meaning of this invention.

The porogen temporarily occupies the pore regions to provide (together with the dielectric matrix) a continuous nonporous surface on which materials such as diffusion barrier layers and conductive seed layers can be conformally deposited as smooth continuous films. Porous dielectric materials (which do not have porogen filling their voids) provide a rougher surface that can be difficult to cover with continuous thin layers that do not penetrate into interior regions of the dielectric material. In most processes described herein, the porogen is present only temporarily in the dielectric material. It is removed after, for example, formation of barrier films, deposition of conductive material and planarization to produce a porous low-k dielectric layer. Generally, composite dielectric materials are better able to withstand the pressures encountered in CMP and other processes employed in semiconductor device fabrication. However, strengthening the dielectric matrix by treatment with UV radiation or other appropriate stimulus, as described below, can greatly improve the ability of porous dielectrics to withstand aggressive processing.

The term "porogen" refers to any removable phase of a composite dielectric matrix. The term broadly refers to any condensed phase material that occupies regions of a dielectric matrix where the dielectric network material does not penetrate and voids can form. In some cases the porogen is randomly distributed throughout the composite film and other cases it is ordered in a repeating structure throughout the film. The porogen can be introduced into the dielectric at various times in a process sequence—e.g., together with formation of the porous dielectric network or after a porous network was already formed. In the later case, the porogen is sometimes referred to as a sealant.

One preferred class of porogen compounds is the polyfunctional non-aromatic compounds. Examples of such compounds are terpenines such as alpha terpenine (ATRP), norborenes such as 5-ethylidene-2-norbornene (ENB), limonene ($C_{10}H_{16}$), and other related compounds. An example of a different porogen of interest is benzocyclobutene (BCB). Certain polymeric materials such as photoresist and BARC materials can also be used as porogens. BARC (bottom anti-reflective coating) materials are strongly UV absorbing materials conventionally used beneath photoresist to absorb and thereby prevent reflection of UV radiation. Another class of porogen is one phase produced by template forming compounds such as certain block copolymer materials (e.g., polyethylene oxide (PEO)-polypropylene oxide (PPO) block copolymers) used to form ordered mesoporous films. The hydrophilic (e.g., PEO) and hydrophobic (e.g., PPO) components form separate phases within a polymer matrix (the template). In one approach, a silica-forming precursor is introduced to the template by, for example, supercritical infusion. Within the template, the precursor locates in its thermodynamically preferred phase and there reacts to produce the dielectric network. The reaction may be driven by introducing a catalyst.

A porogen may be removed from a composite dielectric matrix by thermal methods, treatment with plasma, supercritical extraction, UV-mediated techniques, electron beam treatment and the like. Various porogens and porogen-removal techniques are described below and in, for example, U.S. patent application Ser. No. 10/800,377, filed Mar. 11, 2004 ("METHOD AND APPARATUS FOR UV EXPOSURE OF LOW DIELECTRIC CONSTANT MATERIALS FOR POROGEN REMOVAL AND IMPROVED MECHANICAL PROPERTIES" by E. Srinivasan et al.), which is incorporated herein by reference for all purposes.

The term "dielectric network" describes the dielectric material that remains at the end of the process and serves as the porous dielectric matrix in accordance with methods of this invention. Spaces within the dielectric network are filled with porogen or vapor (e.g., air) at various stages of the process. The network itself is a condensed phase material, typically a solid. It forms an extended three-dimensional covalently bonded network of atoms such as silicon, oxygen, carbon, and hydrogen. Typically it exists as a cross-linked structure and as such a layer of the material may be viewed as a single molecule. A dielectric network of this invention is not comprised of small discrete molecules such as monomers. This does not mean the dielectric network cannot include dopant atoms and other relatively loosely affiliated elements and compounds; In many cases, the composite dielectric layer is formed under conditions that directly produce the dielectric network without the need for further polymerization or other network forming process.

Examples of materials that may serve as the dielectric network include silicon oxides (including silicon okycarbides or carbon doped silicon oxides), fluorinated silicate glasses, silicon nitrides, spin-on materials (both organic and inorganic), and spin-on inorganic-hybrid materials. Carbon doped silicon oxides are preferred for many applications. These are composed of, at least, silicon, oxygen, hydrogen, and carbon. A typical chemical composition of as deposited CDO includes 10–25 atomic percentage silicon, 10–60 atomic percentage oxygen, 10–40 atomic percentage carbon and 20–40 atomic percentage of hydrogen. In certain embodiments, other elements may be present in the CDO films. Preferably the dielectric network has a relatively low intrinsic dielectric constant; e.g., below about 5. Examples include silicon dioxide (~4.2), fluorinated silicate glass (~3.6–3.7), and silicon oxycarbide (~2.7–3.1).

Those of skill in the art understand that precursors are frequently employed to form the dielectric network. Different types of precursor are appropriate for different types of dielectric material and different types of deposition processes. In the case of silicon oxide films formed via a chemical vapor deposition technique (e.g., PECVD), examples of precursors include silanes, alkylsilanes (e.g., trimethylsilane and tetramethylsilane), alkoxysilanes (e.g., methyltriethoxysilane (MTEOS), methyltrimethoxysilane (MTMOS) diethoxymethylsilane (DEMS), methyldimethoxysilane (MDMOS), trimethylmethoxysilane (TMMOS) and dimethyldimethoxysilane (DMDMOS)), linear siloxanes and cyclic siloxanes (e.g. octamethylcyclotetrasiloxane (OMCTS) and tetramethylcyclotetrasiloxane (TMCTS)).

While the present invention may be used with conventional dielectric materials, it is by no means limited to them. Other dielectric materials such as CDO films containing unsaturated carbon-carbon bonds (i.e., double and triple bonds) may also be used. See U.S. patent application Ser. No. 10/789,103, filed on Feb. 27, 2004 by Wu, et al., and titled "Methods for Producing Low-K CDO Films with Low Residual Stress" which is incorporated in its entirety by reference herein for all purposes. Films that incorporate unsaturated bonds may have improved mechanical properties, specifically high mechanical strength and low intrinsic stress.

The term "electronic device" as used herein refers to any device employing circuitry on a substrate. Typically, an electronic device is formed on a semiconductor substrate or other structure possessing a semiconductor material. In many cases, an electronic device provides logic or memory. The term "electronic device" subsumes partially fabricated devices (such as partially fabricated integrated circuits) as well as completed devices available for sale or installed in particular apparatus. In short, an electronic device may exist at any state of manufacture that employs a method of this invention or possesses a structure of this invention.

Process Flow

The present invention may be embodied in a variety of distinct process sequences. As indicated above, the processes generally introduce voids or porosity into a dielectric layer relatively late in the fabrication process. And as indicated, typically that fabrication process is formation of a metallization layer in an integrated circuit. FIG. 1A depicts a general sequence of operations that is common to many embodiments of the present invention.

As depicted in FIG. 1A, the process begins with formation of a dielectric layer on a substrate. See block 103. Generally, the dielectric layer formed at this stage will include a porous dielectric network that may or may not have its pores filled with a porogen. If the porogen is not employed at this stage in the process, it will be introduced at a later stage as described in the text associated with FIG. 1C, for example.

The dielectric layer formed at 103 is subsequently patterned to define line paths associated with interconnects in a metallization layer of an integrated circuit. See block 105 in FIG. 1A. Typically, the patterning will be accomplished using a conventional process such as photolithography and etching, but other techniques can be used as well. For example, electron beam lithography may be suitable for certain applications.

Next in the process, conductive lines are formed in the previously defined line paths. See block 107. In many cases, this process involves deposition of a diffusion barrier and possibly a conductive seed layer (e.g., a thin copper layer). As explained with reference to the damascene process flow described below, the seed layer is employed to provide a conductive surface on which to electroplate bulk copper or other conductive material to form the current carrying lines in an electronic device.

Depending upon the process, it may be necessary to remove excess metal or other conductive material formed during operation 107. In a conventional example "overburden" (electroplated metal that extends out beyond the line paths and over the field regions) is removed by a planarization process such as chemical mechanical polishing). If this operation is required, it typically will be performed after operation 107 but before the point where voids are introduced into the dielectric layer (see block 109).

In operation 109, the voids are finally introduced into the dielectric layer to reduce the effective dielectric constant. This may be accomplished by various techniques, but generally involves removing the porogen from the composite dielectric layer.

Figure 1B:
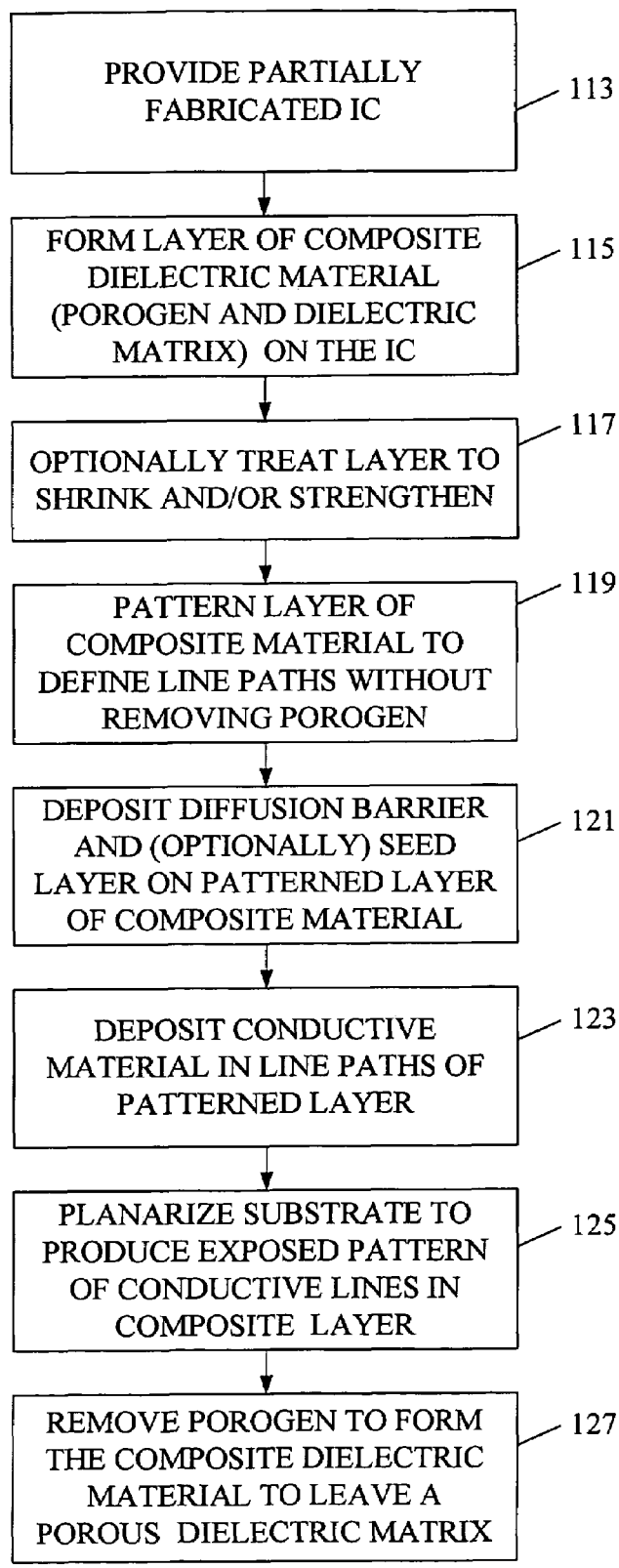
FIG. 1B is a flow diagram depicting a process of this invention in which a composite dielectric layer is treated to shrink the layer prior to patterning.
Figure 1C:
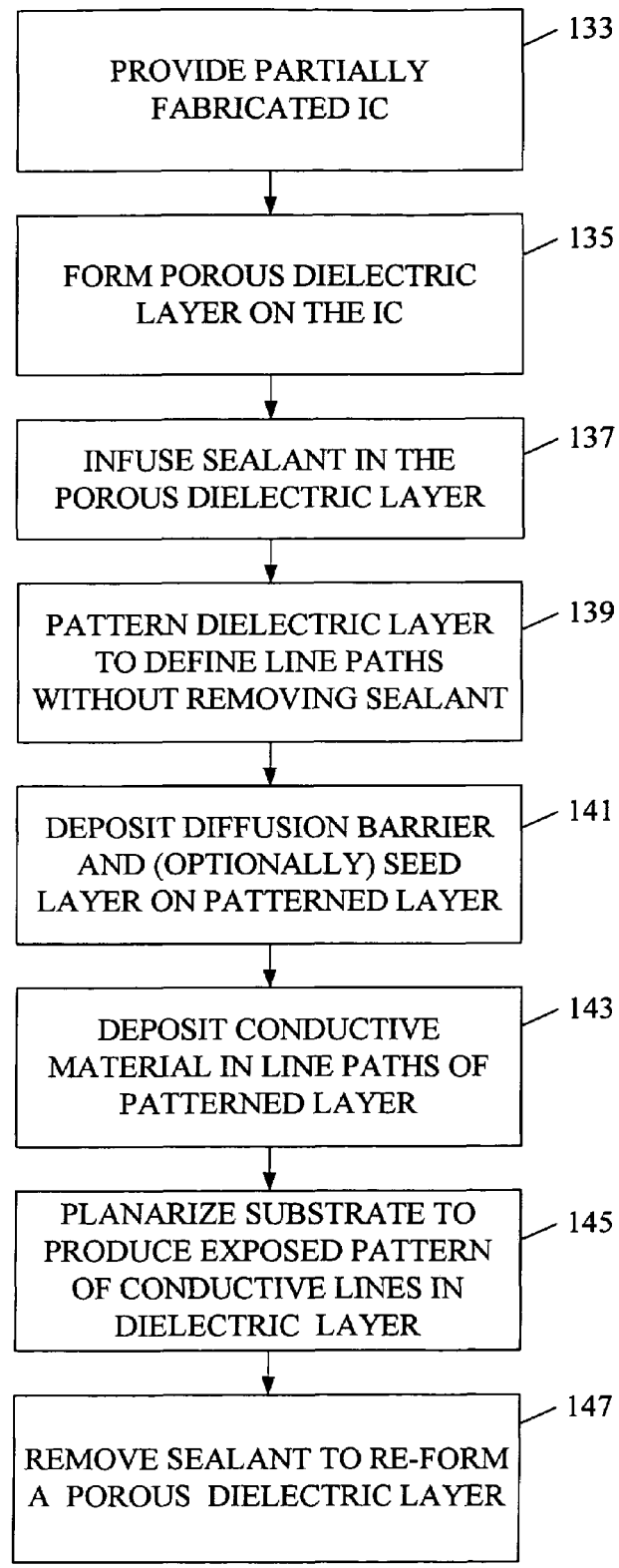
FIG. 1C is a flow diagram depicting a process of this invention in which a dielectric layer that is initially porous is sealed prior to inlaying to form conductive lines.

As indicated, the general process flow depicted in FIG. 1A may be implemented in any one of many different specific embodiments. Three of these are depicted in other figures, FIGS. 1B–D. In FIG. 1B, the "as deposited" dielectric layer includes both the porogen and dielectric network. In FIG. 1C, the as deposited dielectric layer is initially porous. Subsequently, the pores are filled with a porogen, which is removed at a later stage in the process.

Turning first to FIG. 1B, the process begins at an operation 113 where a partially fabricated integrated circuit is made available for formation of a metallization layer in accordance with this embodiment of the invention. The partially fabricated integrated circuit may have an exposed pattern of interconnects in an underlying metallization layer or exposed active device contacts such as polysilicon gates in an underlying active device layer.

On this substrate, the process forms a layer of composite dielectric material having porogen and the dielectric matrix. See block 115. As indicated, this composite dielectric material should form a generally continuous solid or solid-like layer that is substantially void free. In a specific implementation, the composite dielectric material is formed by a chemical vapor deposition (CVD) or plasma enhanced chemical vapor deposition (PECVD) process that co-deposits the porogen and the dielectric network.

Frequently, the as deposited composite layer will shrink during subsequent processing to remove porogen and/or strengthen the dielectric matrix. If the dielectric layer was to shrink after the conductive lines were formed, it might create misaligned conductive paths and/or high levels of stress and concomitant damage to the materials in the metallization layer. To address this potential difficulty, the process of FIG. 1B employs a treatment that shrinks and optionally strengthens the composite dielectric layer. See block 117. As indicated below, this treatment may involve exposure to ultraviolet radiation in one example. Typically, this operation is conducted in a manner that does not remove porogen from the layer.

After the composite dielectric layer has been sufficiently strengthened and/or shrunk to a dimensionally stable level, it may be patterned and otherwise treated to form the conductive line paths necessary in the metallization layer. To this end, an operation 119 is depicted for patterning the composite layer to define line paths, and doing so without significantly removing porogen. In an alternative embodiment, the composite dielectric layer is patterned prior to the treatment to shrink/strengthen the layer. In other words, operations 117 and 119 are reversed.

With the porogen in place, relatively smooth continuous sidewalls and trench bottoms are available for receiving deposited conformal layers such as layers of diffusion barrier and seed layer. As indicated, the smooth surface provides for deposition of high quality conformal layers of diffusion barrier and seed metal. See block 121. This then allows deposition of high quality conductive material in the line paths of the patterned layer. See block 123. Again, a conventional damascene process may be employed in implementing the operations depicted in blocks 121 and 123.

The next operation in the process is depicted at block 125. It involves planarizing the substrate to produce an exposed pattern of conductive lines in the composite dielectric layer. In a normal damascene process flow, no further treatment of the dielectric would be required at this stage. In the present embodiment, however, a separate operation is employed to remove porogen from the composite dielectric material in a manner that leaves behind a low-k porous dielectric matrix. See block 127. Because the dielectric layer was previously treated to improve dimensional stability during subsequent process steps, operation 127 can be performed without significantly shrinking the dielectric matrix. Thus, the operation can be performed without significantly increasing internal stress in the layer.

From this point forward, conventional processing may be employed to complete formation of the metallization layer and prepare for creation of a next higher metallization layer (or for passivation if the current metallization layer is the last metallization layer required for the integrated circuit).

FIG. 1C depicts a separate embodiment of the present invention, one in which the "as deposited" dielectric layer is initially porous or made porous' early in the process. The process begins, as before, with a partially fabricated integrated circuit as indicated at block 133. However, the process next involves formation of a porous dielectric layer on the integrated circuit as indicated at block 135. Presumably, this porous dielectric layer is dimensionally stable and requires no further treatment to ensure such stability. However, if the material does exhibit shrinkage, it may be appropriate to provide an appropriate treatment at this stage to ensure dimensional stability through subsequent process steps. Note that a porous dielectric material may be directly deposited by various techniques such as a spin-on process. It is also within the scope of this invention that the porous dielectric layer could be produced by one of the processes described herein that employ a composite dielectric layer of porogen and a dielectric network.

The next operation in the process involves infusing sealant (porogen) into the porous dielectric layer. See block 137. As indicated elsewhere herein, this may be accomplished by spin-on deposition, atomic layer deposition, chemical vapor deposition, in situ polymerization, liquid impregnation, vapor impregnation, or supercritical injection.

Next, the dielectric layer with infused sealant is patterned to define line paths in a manner that accomplishes this without removing the sealant from the pores of the dielectric layer. See block 139. Thereafter, the diffusion barrier and optionally the seed layer are conformally deposited on the patterned layer as indicated at block 141. From this point, the conductive material such as copper metal is deposited in the line paths of the patterned layer to form the current carrying lines of the metallization layer. See block 143. Note that operations 141 and 143 should be performed in a manner that ensures that little if any of the sealant is removed from the dielectric pores during these processes.

Next, the substrate is planarized to remove excess conductive material and produce an exposed pattern of the conductive lines in the dielectric layer. See block 145. Note that at this stage, the temporarily introduced sealant still remains in the dielectric layer. Thus, it is necessary to now remove the sealant to re-form the porous dielectric layer to give a low dielectric constant, as required for high performance applications. See block 147.

Figure 1D:
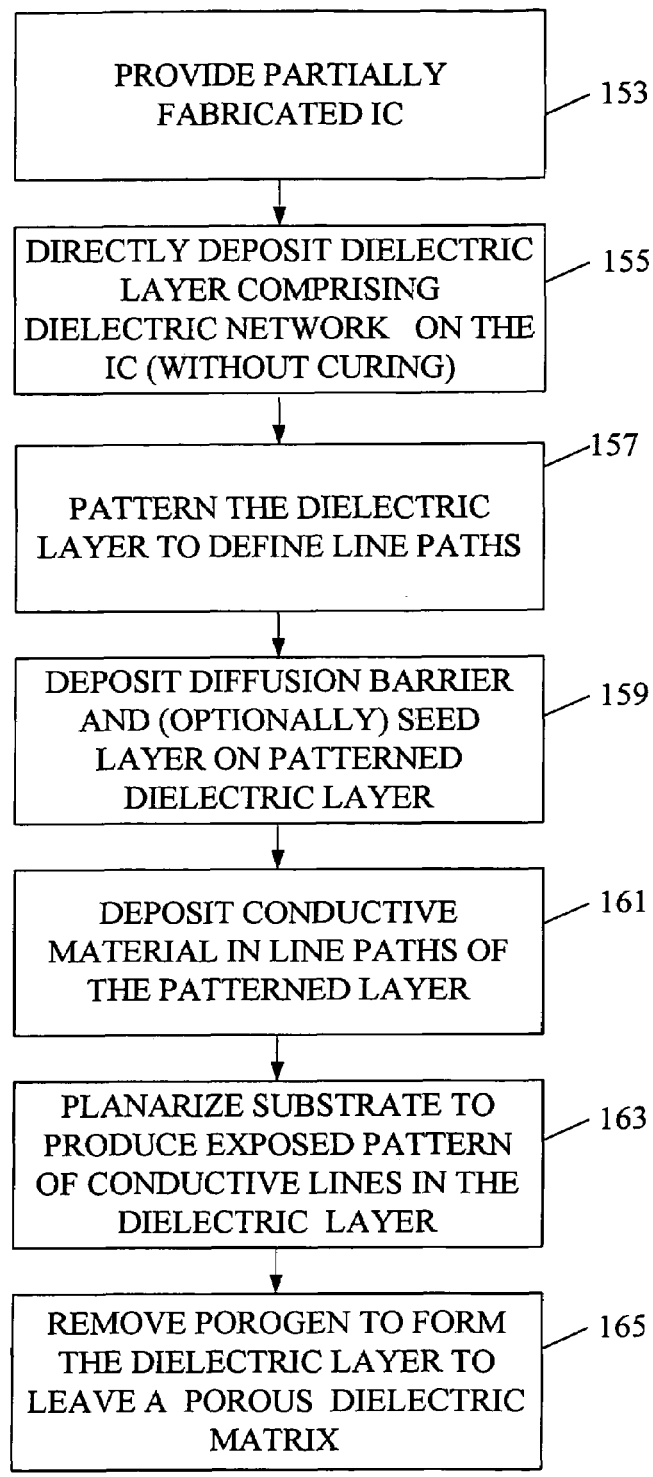
FIG. 1D is a flow chart depicting a process of this invention in which the dielectric matrix is deposited directly, without curing.

FIG. 1D is a process flow representing another aspect of the invention. In this aspect, the as deposited dielectric layer (which may or may not include porogen) comprises a dielectric network. The network is formed directly and therefore does not require curing or other post-deposition polymerization step.

As shown in FIG. 1D, the process is similar to that of FIG. 1B. The process begins with a partially fabricated integrated circuit on which a metallization layer or other layer of conductive lines is to be formed. Block 153. The process then directly forms a dielectric layer comprising a dielectric network on the substrate as indicated at block 155. This is accomplished without the need to cure or polymerize a deposited precursor to the dielectric network. Instead, the as-deposited dielectric layer comprises a dielectric network as described above (typically an extended three-dimensional covalent network). The porogen may be deposited together with the dielectric network or added at a later time, preferably before patterning.

As shown in FIG. 1D, the dielectric layer is patterned (157), covered with thin layers of diffusion barrier and seed (159), filled with a conductive material (161), and planarized (163). At the conclusion of this process, the porogen is removed to produce the final porous dielectric matrix.

Figure 2A:
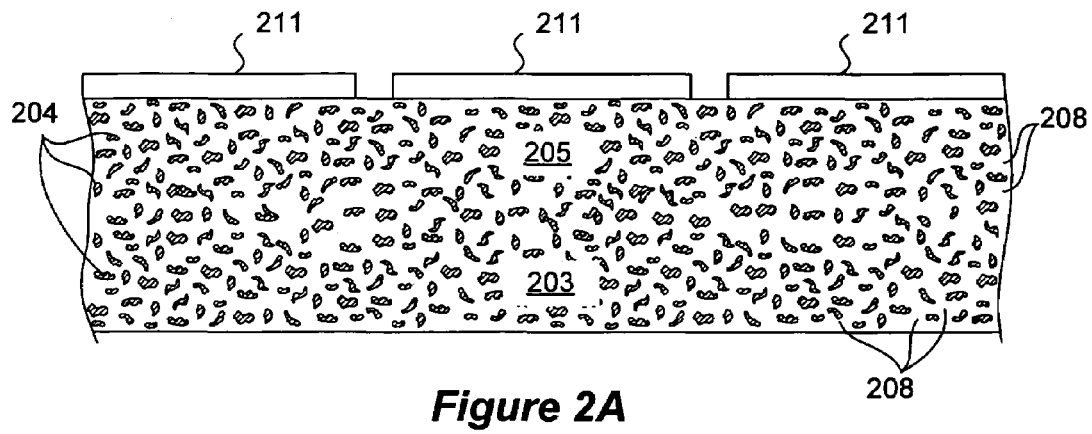
FIG. 2A is a cross sectional diagram of a dielectric layer prior to a via etch in a damascene process.

For context, FIGS. 2A through 2D depict a dual damascene approach to operations 103, 105, and 107 of FIG. 1A. In a typical dual damascene process, first and second layers of composite dielectric are deposited in succession, possibly separated by deposition of an etch stop layer, such as a silicon nitride layer. These layers are depicted in FIG. 2A as first composite dielectric layer 203 and a second composite dielectric layer 205. These are formed on an adjacent portion of a substrate 209, which portion may be an underlying metallization layer or a gate electrode layer (at the device level). Note that in some damascene processes, the two layers 203, 205 may be formed as a single layer. Whether formed as a single layer or two layers, the resulting structure should be sufficiently thick to allow formation of both vias and trenches.

Each composite dielectric layer contains both a dielectric network 208 and porogen 204. In the case of the process depicted in FIG. 1C, the porogen (or sealant) is introduced in the layers after they formed, separately or after each layer is formed.

After the dielectric layer or layers have been deposited, operation 117 of the FIG. 1B process may be performed. In other words, the composite dielectric layers may be treated with ultraviolet radiation or other stimulus to shrink the composite dielectric to a dimensionally stable size. As mentioned, details of this process will be provided below.

Figure 2B:
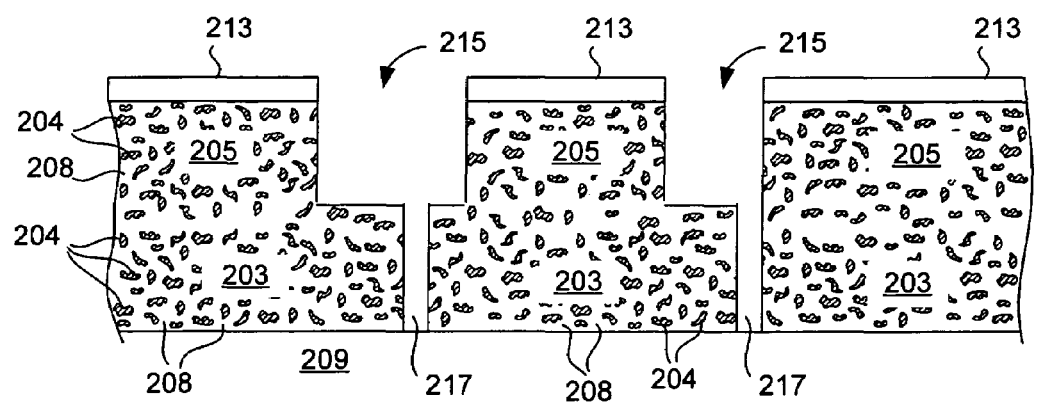
FIG. 2B is a cross sectional diagram of the dielectric layer of FIG. 2A after a line etch has been performed.
Figure 2C:
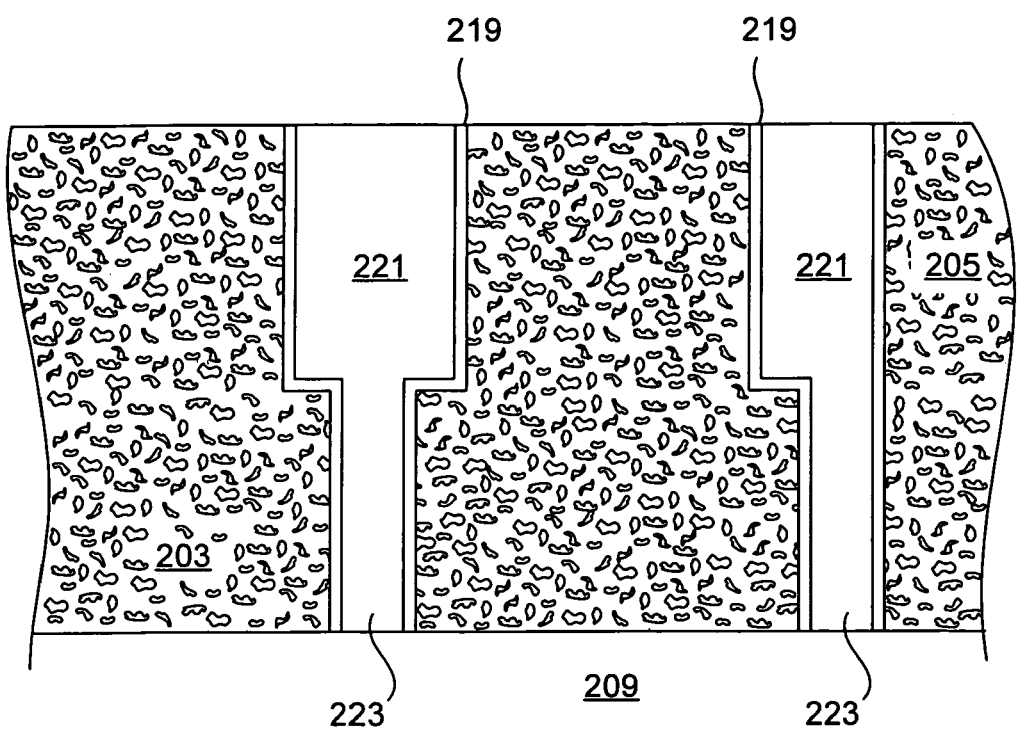
FIG. 2C is a cross sectional diagram of the dielectric layer of FIGS. 2A and 2B after the etched regions have been filled with metal to form lines and vias.
Figure 2D:
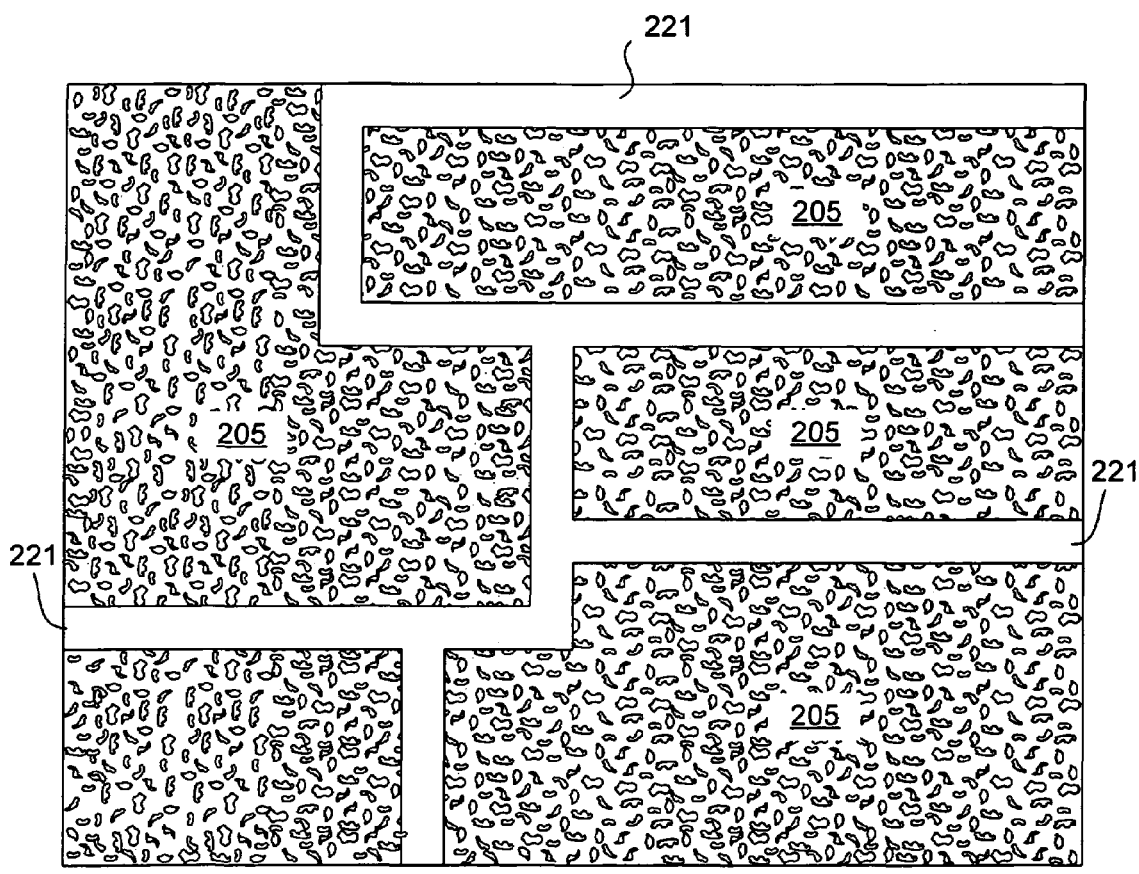
FIG. 2D is a top view of a simplified version of the layer prepared as in FIG. 2C.

After deposition of the second composite dielectric layer 205, the process forms a via mask 211 having openings where vias will be subsequently etched. Next, the vias are partially etched down to an intermediate level. Then via mask 211 is stripped off and replaced with a line mask 213 as depicted in FIG. 2B. A second etch operation is performed to remove sufficient amounts of dielectric to define line paths 215 in second dielectric layer 205. The etch operation also extends via holes 217 through first dielectric layer 203, down to contact the underlying substrate 209. See FIG. 2B. In alternative embodiments, the trenches are etched first and the vias second.

Next the process forms a thin layer of conductive barrier layer material 219 on the exposed surfaces (including sidewalls) of composite dielectric layers 203 and 205. Because copper frequently provides the conductive paths in the electronic device, the dielectric materials must be protected from diffusing metal (e.g., copper) that might otherwise diffuse or drift into the dielectric layer. Suitable materials for a copper diffusion barrier include tantalum, tantalum nitride, tungsten, titanium tungsten, titanium nitride, tungsten nitride, and the like. In a typical process, the barrier layer is formed by a physical vapor deposition (PVD) process such as sputtering, a chemical vapor deposition (CVD) process, or an atomic layer deposition (ALD) process.

On top of the barrier layer 219, the process deposits conductive metal (typically copper) in the via holes and line paths 217 and 215. Conventionally this deposition is performed in two steps: an initial deposition of a conductive seed layer followed by bulk deposition of copper by electroplating. The seed layer may be deposited by physical vapor deposition, chemical Vapor deposition, electroless plating, etc. Note that the bulk deposition of copper not only fills line paths 215 but, to ensure complete filling, covers all the exposed regions on top of second dielectric layer 205.

Thus, it becomes necessary to remove the excess copper from the device. A planarization is often employed to planarize a wafer surface and removes material down to the level of the top of dielectric layer 205. This produces an exposed pattern of conductive lines 221 in dielectric layer 205 and vias in dielectric layer 203. See the cross-sectional view of FIG. 2C and the simplified top view of FIG. 2D. Note that the porogen 204 may be conveniently removed from dielectric matrix after the excess metal has been removed as indicated.

One widely used planarization process is chemical mechanical polishing (CMP). This process, or any process like it that applies downward pressure on the partially fabricated electronic device, can crack, crush, or otherwise destroy a highly porous low dielectric constant dielectric layer. One benefit of the present invention is that it allows a conventional pressure-based planarization technique in a fabrication technology employing a "porous" dielectric layer. It accomplishes this by introducing voids only after the pressure-based planarization technique has been completed. Note that the invention is not limited to use with planarization process that apply pressure to the underlying dielectric layer. Thus, it is not limited to CMP. It may also involve, for example, a combination of electropolishing, to remove most of the excess bulk copper, followed by CMP to remove the remaining copper down to the level of the top surface of dielectric layer 205.

Note that the present invention is not limited to dual damascene processes of the type depicted in FIGS. 2A–2D. It also applies to single damascene and various non-damascene processes for forming patterns of conductive features in dielectric layers.

Methods for Introducing Porogens in a Composite Layer

As indicated, the composite dielectric layer may be formed by co-depositing porogen and the dielectric network or it may be formed by infusing porogen into a pre-formed porous dielectric matrix. In the former case, deposition may be accomplished by providing the porogen together with a dielectric precursor to a CVD reactor. The deposition conditions are chosen so that the porogen coalesces in particular locations within the dielectric network as it forms by reaction of the precursors on the substrate surface. Appropriate conditions for co-depositing porogen and the dielectric network are well known in the art. See e.g., U.S. Pat. No. 6,312,793 (issued Nov. 6, 2001) to A. Grill et al., which is incorporated herein by reference for all purposes.

General template-based processes for creating the composite layer are known in the art. As indicated these processes involve initial formation of a template (e.g. a two-phase mesoporous block co-polymer), infusion of a dielectric precursor that preferentially localizes in one phase, and reaction of the precursor to produce a dielectric network. The phase where the dielectric did not form (the porogen) is subsequently removed. See for example, U.S. patent application Ser. No. 10/404,693 filed Mar. 31, 2003 by Humayun, et al., and titled "Method for Forming Porous Films by Porogen Removal Combined With In Situ Surface Modification," and U.S. patent application Ser. No. 10/295,965 filed Nov. 15, 2002 by Schulberg, et al., and titled "System for Deposition of Mesoporous Materials," both of which are incorporated herein by reference for all purposes.

In cases where the porogen or sealant is infused into a porous dielectric matrix, the infusion may be accomplished by spin-on, CVD, ALD, in situ polymerization, liquid impregnation, vapor impregnation, supercritical injection and the like. In another approach, porogen is formed by condensation of a porogen precursor and subsequent polymerization. In this approach, a vapor phase monomer is allowed to selectively condense on the substrate and there polymerize. To promote selective condensation, the substrate may be maintained at a lower temperature than a reactor walls.

Treatments for Shrinking and Improving Strength

The procedures for shrinking a composite dielectric layer to render it dimensionally stable in subsequent process steps (including porogen removal) include exposure to ultraviolet radiation, particularly modulated ultraviolet radiation. Modulated ultraviolet radiation treatments are described in U.S. patent application Ser. No. 10/825,888, which was previously incorporated by reference.

Preferably, the treatment has minimal impact on the porogen itself. For example, the treatment should not remove significant amounts of the porogen from the composite dielectric layer. In one embodiment, ultraviolet radiation is employed in two separate treatments: first to shrink/strengthen the dielectric matrix and second to remove the porogen. The porogen should be chosen that it is relatively immune to the first treatment. Preferably, the chosen porogen has a relatively narrow absorption band (e.g., 290–300 nanometers) that is well removed from an absorption edge (e.g., less than about 250 nanometers) where radiation can shrink and/or strengthen the dielectric matrix.

In preferred embodiments, the procedures employed to shrink the composite dielectric layer are sufficiently effective that during the subsequent porogen removal operation, the dielectric layer shrinks by no more than about 2%. As indicated, the treatment may also strengthen the dielectric matrix. The strengthening may be manifest by increasing its modulus, cracking threshold, toughness (resistance to crack propagation), etc.

Techniques for Removing Porogens

Techniques for removing porogen from the composite film include, for example, thermal processes in which the substrate is heated to a temperature sufficient for the breakdown and vaporization of the organic porogen, treatment with plasma, supercritical extraction, UV-mediated techniques, electron beam treatment, etc.

Thermal techniques for porogen removal involves heating the wafer to a temperature of approximately 400 C or greater for a period of time (e.g., several minutes to several hours) to thermally degrade and remove the porogen. During the process, the wafer is maintained in an environment where the thermal products (porogen vapor and/or decomposition products) are removed. Thus, the process may take place under flowing inert gas or in a vacuum.

Another technique involves exposing the wafer to a plasma treatment while heating the wafer. Specific plasma removal techniques and plasma conditions are described in U.S. patent application Ser. No. 10/785,235, filed on Feb. 23, 2004, titled "Plasma Detemplating and Silanol Capping of Porous Dielectric Films" by Wang et al., which was previously incorporated by reference. In some cases, the wafer may be treated with a capping agent to tie up silanol groups and dangling bonds produced during plasma treatment. Examples of capping agents include certain silane amines, alkyl alkoxysilanes, chlorosilanes, and aldehydes. Specific examples include hexamethyldisilazane, dimethyldimethoxysilane, trimethylchlorosilane, and an acetaldehyde. In some embodiments, the capping agent may be present in the reactor environment while the plasma processing takes place. In other embodiments, the capping takes place after the plasma treatment. Thus, porogen removal and silanol capping may be performed contemporaneously or sequentially. If performed sequentially, silanol capping is preferably performed without first exposing the dielectric matrix to moisture or ambient conditions.

UV-mediated porogen removal techniques are described in U.S. patent application Ser. No. 10/785,235, filed on Feb. 23, 2004, titled "Plasma Detemplating and Silanol Capping of Porous Dielectric Films" by Wang et al., which was previously incorporated by reference. Note that a preferred UV-mediated technique for removing porogen involves exposure to a modulated UV source in which the UV intensity on the wafer varies in a periodic fashion. Appropriate modulation frequencies, UV wavelength distributions, and source configurations are described in U.S. patent application Ser. No. 10/825,888, filed on Apr. 16, 2004, titled "Method to Improve Mechanical Strength of Low-K Dielectric Film Using Modulated UV Exposure" by Bandyopadhyay et al.

Other discussions of interest (UV-mediated porogen removal) are found in U.S. patent application Ser. No. 10/672,311, filed on Sep. 26, 2003, titled "Method of Porogen Removal from Porous Low-k Films Using UV Radiation," by Adrianne Tipton et al., and U.S. patent application Ser. No. 10/404,693, filed on Mar. 31, 2003, titled "Method for Forming Porous Films by Porogen Removal Combined with In Situ Surface Modification," by Raashina Humayun et al. Each of these patent applications is incorporated herein by reference for all purposes. A silanol capping agent (as discussed above) may be used in conjunction with the UV-mediated porogen removal.

Porogen extraction using supercritical extraction employs a supercritical or near supercritical solvent such as carbon dioxide to contact the composite dielectric layer and extract the porogen from within the small pores of the dielectric network. The excellent penetrating power of supercritical solvents allow them to effectively reach pores deep within the dielectric matrix. The supercritical fluid may contain one or more additives such as an oxidant that can oxidize the porogen and thereby facilitate its removal. In specific embodiments, the supercritical fluid contains between about 0.5% to 5% hydrogen peroxide by weight. Also in some embodiments, the supercritical fluid contains co-solvents to aid in the dissolution of the porogen and/or to increase the solubility of an oxidant. In some embodiments, the supercritical solution comprises a nitrite such as acetonitrile or benzonitrile. In a specific example, the solution comprises between about 5% and 15% acetonitrile. Suitable temperatures at which the precursor film is exposed to the supercritical fluid generally range between about 75 and 150 degrees Celsius. A silanol capping agent (as discussed above) may be used in conjunction with the supercritical extraction. Porogen extraction using supercritical extraction is describe in detail in U.S. patent application Ser. No. 10/672,305, filed on Sep. 26, 2003, titled "Method for Removal of Porogens from Porous Low-k Films Using Supercritical Fluids," by Adrianne Tipton et al., which is incorporated herein by reference in its entirety for all purposes.

One side benefit sometimes associated with the porogen removal process is improved mechanical properties of the resulting porous dielectric layer. These mechanical properties include hardness, modulus, film residual stress, blanket film cracking threshold or limit, fracture toughness (i.e., resistance to crack propagation), etc. These properties are dependent on the strength of the atomic bonds and their binding energies. Under certain conditions, porogen removal and pre-treatment operations (e.g., operation 117 in the process of FIG. 1B) can modify the internal structure of the dielectric network and thereby improve these mechanical properties.

Dielectric materials with inferior mechanical properties will tend to have adhesive failures (delamination) and cohesive failures (cracking) during the copper-low k integration and packaging steps. These failures are exacerbated by the increasing complexity of integrated circuits and frequently manifest with growing numbers of metallization layers.

While the processes of this invention need not improve the mechanical properties of the resulting dielectric materials, it is generally desirable that materials have a modulus that is higher than about 3 GPa, more preferably higher than about 6 GPa. Measures of film modulus may be made with any suitable apparatus including a nano-indenter device.

The total residual stress of the dielectric layers produced in accordance this invention is preferably less than about 50 MPa tensile stress, and more preferably less than about 30 MPa tensile stress. If the film exhibits a net intrinsic compressive stress, the magnitude of that compressive stress is preferably less than about −30 MPa, and more preferably less than −20 MPa compressive. One suitable apparatus used to measure internal stress is the "Flexus" tool purchased from KLA-Tencor Corporation. But any tool that accurately measures bow or other deviation from planarity in a wafer can be employed.

One manifestation of residual tensile stress in a film is cracking. A film's cracking threshold is a measure of the thickness of the film on a blank substrate (e.g., a flat 200 mm wafer) that can be deposited without forming a crack. In a typical experiment, the dielectric film is deposited to various thicknesses using a single set of process conditions. The resulting wafer (with dielectric layer) is set aside without disturbance for a period of time (e.g., one day) and examined for cracks. The greatest thickness at which no crack is observed is the cracking threshold. For many processes, the cracking threshold is measured in µm. For the purposes of this invention, the cracking threshold is greater than about 3 µm. Most preferably, the cracking threshold is greater than about 5 µm.

Other Embodiments

While this invention has been described in terms of a few preferred embodiments, it should not be limited to the specifics presented above. Many variations on the above-described preferred embodiments may be employed. For example, while the invention has been described primarily in terms of preparing "porous" dielectrics in integrated circuits, it is not so limited. In some embodiments, the invention may be employed in non-semiconductor devices. Therefore, the invention should be broadly interpreted with reference to the following claims.

What is claimed is:

1. A method of forming a layer comprising conductive lines on a substrate, the method comprising:
    (a) providing a layer of composite dielectric material on the substrate, wherein the composite dielectric material comprises a dielectric network and a porogen;
    (b) treating the dielectric network in a manner that shrinks and/or strengthens the layer of dielectric material;
    (c) patterning the layer of composite dielectric material to define paths for the conductive lines;
    (d) filling the paths with conductive material; and
    (e) after filling the paths in (d), removing at least some of the porogen from the layer of composite dielectric material to produce a porous dielectric network.

2. The method of claim 1, further comprising removing excess conductive material formed in (d) prior to removing the porogen in (e), to thereby form an exposed pattern of conductive lines in the composite dielectric material.

3. The method of claim 2, wherein removing the excess conductive material also serves to produce a planarized surface.

4. The method of claim 1, wherein treating the dielectric network serves to strengthen the dielectric network.

5. The method of claim 1, wherein treating the dielectric network comprises exposing the dielectric network to at least one of the following: ultraviolet radiation, e-beam radiation, and a plasma.

6. The method of claim 1, wherein the dielectric network comprises a material selected from the group consisting of silicon oxide, a carbon doped silicon oxide, a fluorinated silicate glass, silicon nitride, a spin-on organic material, a spin-on inorganic material, and a spin-on inorganic-hybrid material.

7. The method of claim 1, wherein the dielectric network comprises an extended three-dimensional covalently bonded network.

8. The method of claim 1, wherein the dielectric network comprises a three-dimensional cross-linked structure.

9. The method of claim 1, wherein the conductive material is copper.

10. The method of claim 1, wherein filling the paths with a conductive material comprises plating the conductive material.

11. The method of claim 1, wherein removing at least some of the porogen from the layer of composite dielectric material comprises exposing the composite dielectric material to at least one of the following: a supercritical solvent, a plasma, a thermal treatment, ultraviolet radiation, and e-beam radiation.

12. The method of claim 1, wherein (c) is performed prior to (b).

13. A method of forming a layer comprising conductive lines on a substrate, the method comprising:

(a) forming a layer of porous dielectric material on the substrate, wherein the porous dielectric material comprises voids;
(b) filling at least some voids in the dielectric material with a sealant;
(c) patterning the layer of composite dielectric material to define paths for the conductive lines;
(d) filling the paths with conductive material; and
(e) after filling the paths in (d), removing at least some of the sealant from the dielectric material.

14. The method of claim 13, further comprising removing excess conductive material formed in (d) prior to removing the porogen in (e), to thereby form an exposed pattern of conductive lines in the composite dielectric material.

15. The method of claim 14, wherein removing the excess conductive material also serves to produce a planarized surface.

16. The method of claim 13, wherein the sealant is a photoresist material, benzocyclobutene, or a BARC compound.

17. The method of claim 13, wherein filling at least some voids comprises ALD, spin-on, CVD, in situ polymerization, liquid impregnation, vapor impregnation, or supercritical injection.

18. The method of claim 13, wherein the conductive material is copper.

19. The method of claim 13, wherein filling the paths with a conductive material comprises plating the conductive material.

20. The method of claim 13, wherein removing at least some of the sealant from the dielectric material comprises exposing the dielectric material to at least one of the following: a supercritical solvent, a plasma, a thermal treatment, ultraviolet radiation, and e-beam radiation.

21. The method of claim 13, wherein the dielectric material comprises a three-dimensional cross-linked structure.

22. The method of claim 13, wherein the dielectric material is selected from the group consisting of silicon oxide, a carbon doped silicon oxide, a fluorinated silicate glass, silicon nitride, a spin-on organic material, a spin-on inorganic material, and a spin-on inorganic-hybrid material.

23. The method of claim 13, wherein (b) is performed prior to (c).

24. The method of claim 13, wherein (c) is performed prior to (b).

25. A method of forming a layer comprising conductive lines on a substrate, the method comprising:
(a) directly depositing a dielectric layer comprising a dielectric network on the substrate, without curing or polymerizing the as deposited dielectric material;
(b) treating the dielectric network in a manner that shrinks and/or strengthens the layer of dielectric material;
(c) patterning the dielectric layer to define paths for the conductive lines;
(d) filling the paths with conductive material; and
(e) after filling the paths in (d), removing porogen from the dielectric layer to produce a porous dielectric network.

26. The method of claim 25, whererin the porogen is deposited together with the dielectric network in the dielectric layer.

27. The method of claim 25, wherein the porogen is added to the dielectric layer after (a) but before (c).

28. The method of claim 25, further comprising removing excess conductive material formed in (d) prior to removing porogen in (e), to thereby form an exposed pattern of conductive lines in the dielectric layer.

29. The method of claim 28, wherein removing the excess conductive material also serves to produce a planarized surface.

30. The method of claim 25, wherein the dielectric network comprises a material selected from the group consisting of silicon oxide, a carbon doped silicon oxide, a fluorinated silicate glass, silicon nitride, a spin-on organic material, a spin-on inorganic material, and a spin-on inorganic-hybrid material.

31. The method of claim 25, wherein the dielectric network comprises an extended three-dimensional covalently bonded network.

32. The method of claim 25, wherein the dielectric network comprises a three-dimensional cross-linked structure.

33. The method of claim 25, wherein the conductive material is copper.

34. The method of claim 25, wherein filling the paths with a conductive material comprises plating the conductive material.

35. The method of claim 25, wherein removing at least some of the porogen from the layer of composite dielectric material comprises exposing the composite dielectric material to at least one of the following: a supercritical solvent, a plasma, a thermal treatment, ultraviolet radiation, and e-beam radiation.

36. The method of claim 25, wherein treating the dielectric network comprises exposing the dielectric network to at least one of the following: ultraviolet radiation, e-beam radiation, and a plasma.

* * * * *